US012550730B2

(12) United States Patent
Kobune et al.

(10) Patent No.: US 12,550,730 B2
(45) Date of Patent: *Feb. 10, 2026

(54) METHOD OF MANUFACTURING SEMICONDUCTOR DEVICE, THERMALLY CONDUCTIVE SHEET, AND METHOD OF MANUFACTURING THERMALLY CONDUCTIVE SHEET

(71) Applicant: RESONAC CORPORATION, Tokyo (JP)

(72) Inventors: Mika Kobune, Tokyo (JP); Michiaki Yajima, Tokyo (JP)

(73) Assignee: RESONAC CORPORATION, Tokyo (JP)

( * ) Notice: Subject to any disclaimer, the term of this patent is extended or adjusted under 35 U.S.C. 154(b) by 193 days.

This patent is subject to a terminal disclaimer.

(21) Appl. No.: 17/819,391

(22) Filed: Aug. 12, 2022

(65) Prior Publication Data
US 2022/0392825 A1 Dec. 8, 2022

Related U.S. Application Data

(62) Division of application No. 17/269,523, filed as application No. PCT/JP2018/031195 on Aug. 23, 2018, now Pat. No. 11,482,466.

(51) Int. Cl.
*H01L 23/373* (2006.01)
*H01L 21/48* (2006.01)
*H01L 23/367* (2006.01)

(52) U.S. Cl.
CPC ...... *H01L 23/3737* (2013.01); *H01L 21/4882* (2013.01); *H01L 23/3675* (2013.01)

(58) Field of Classification Search
None
See application file for complete search history.

(56) References Cited

U.S. PATENT DOCUMENTS

| 11,545,413 B2 * | 1/2023 | Kobune | H01L 23/3737 |
| 11,810,834 B2 * | 11/2023 | Kobune | H01L 23/3733 |
| 2020/0402886 A1 | 12/2020 | Kobune et al. | |

(Continued)

FOREIGN PATENT DOCUMENTS

| CN | 103748146 A | 4/2014 |
| CN | 105324844 A | 2/2016 |
| JP | H05-247268 A | 9/1993 |

(Continued)

OTHER PUBLICATIONS

Statement of Relevance filed on May 18, 2022, in related U.S. Appl. No. 17/269,523.

*Primary Examiner* — Jack S Chen
(74) *Attorney, Agent, or Firm* — SOLARIS Intellectual Property Group, PLLC

(57) ABSTRACT

A method of manufacturing a semiconductor device includes: adhering together a heat generating body and a heat dissipating body via a thermally conductive sheet by applying a pressure on the heat generating body and the heat dissipating body in a thickness direction of the thermally conductive sheet with the thermally conductive sheet disposed therebetween, the thermally conductive sheet having a compression modulus of 1.40 MPa or less under a compressive stress of 0.10 MPa at 150° C., and a tack strength of 5.0 N·mm or more at 25° C.

5 Claims, 2 Drawing Sheets

(56) References Cited

U.S. PATENT DOCUMENTS

2021/0183733 A1   6/2021  Kobune et al.
2021/0183734 A1   6/2021  Kobune et al.

FOREIGN PATENT DOCUMENTS

| JP | H05-73959 U | 10/1993 |
| JP | H10-298433 A | 11/1998 |
| JP | 2007-294681 A | 11/2007 |
| JP | 4743344 B2 | 8/2011 |
| JP | 5316254 B2 | 10/2013 |
| JP | 2015-138903 A | 7/2015 |
| WO | 2017/073727 A1 | 5/2017 |

* cited by examiner

… (1) Application No.

METHOD OF MANUFACTURING SEMICONDUCTOR DEVICE, THERMALLY CONDUCTIVE SHEET, AND METHOD OF MANUFACTURING THERMALLY CONDUCTIVE SHEET

CROSS-REFERENCE TO RELATED APPLICATIONS

The present application is a divisional application of U.S. Ser. No. 17/269,523, filed on Feb. 18, 2021, which is a national stage application of International Application No. PCT/JP2018/031195, filed on Aug. 23, 2018. Each of the above applications is hereby incorporated by reference, in its entirety, into the present application.

TECHNICAL FIELD

The present disclosure relates to a method of manufacturing a semiconductor device, a thermally conductive sheet, and a method of manufacturing a thermally conductive sheet.

BACKGROUND ART

In conjunction with the recent increasing wiring density of multilayer wiring boards, increasing wiring density in semiconductor packages, increasing mounting density of electronic components, and increasing heat generation per unit area due to the increased integration of semiconductor devices and the like, improved heat dissipation properties are desired for semiconductor devices.

Good heat dissipation properties are particularly required for semiconductor devices that generate large amount of heat, such as central processing units (CPUs) and power devices. These semiconductor devices have a configuration in which a heat generating body and a heat dissipating body made of aluminum, copper or the like are tightly adhered, with a thermally conductive material, such as grease or a thermally conductive sheet, being disposed therebetween to allow heat dissipation (for example, see Patent Documents 1 to 4).

RELATED ART DOCUMENTS

Patent Documents

[Patent Document 1] Japanese Patent Application Laid-Open (JP-A) No. H05-247268
[Patent Document 2] JP-A No. H10-298433
[Patent Document 3] Japanese Patent No. 4743344
[Patent Document 4] Japanese Patent No. 5316254

SUMMARY OF INVENTION

Technical Problem

In conjunction with the recent improved performances of semiconductor packages, semiconductor chips and semiconductor packages have increased in size. In a case in which grease is used as a thermally conductive material, the increase in size causes the occurrence of pump-out during thermal cycling, making it difficult to ensure sufficient heat dissipation. On the other hand, in a case in which a thermally conductive sheet is used as a thermally conductive material, there is a problem that the increase in size of a heat generating body causes an increase in the amount of warpage of the semiconductor chip or the semiconductor package, encouraging the thermally conductive sheet to detach from the heat generating body and the heat dissipating body, which makes it difficult to ensure heat dissipation.

In view of these circumstances, the present disclosure is directed to providing a method of manufacturing a semiconductor device having an excellent heat dissipation property, a thermally conductive sheet usable in manufacturing a semiconductor device having an excellent heat dissipation property, and a method of manufacturing the thermally conductive sheet.

Solution to Problem

Means for solving the above-described problems include the following embodiments.

(1) A method of manufacturing a semiconductor device, the method including adhering together a heat generating body and a heat dissipating body via a thermally conductive sheet, by applying pressure to the heat generating body and the heat dissipating body in a thickness direction of the thermally conductive sheet with the thermally conductive sheet disposed therebetween, the thermally conductive sheet having a compression modulus of 1.40 MPa or less under a compressive stress of 0.10 MPa at 150° C., and a tack strength of 5.0 N·mm or more at 25° C.

(2) The method of manufacturing a semiconductor device according to (1), wherein the thermally conductive sheet has a thermal conductivity of 7 W/(mK) or higher, the thermal conductivity being obtained using a thermal resistance measured by a steady state method.

(3) The method of manufacturing a semiconductor device according to (1) or (2), wherein the pressure is from 0.05 to 10.00 MPa.

(4) The method of manufacturing a semiconductor device according to (3), wherein the pressure is from 0.10 to 0.50 MPa.

(5) The method of manufacturing a semiconductor device according to any one of (1) to (4), wherein the heat generating body is a semiconductor chip and the heat dissipating body is a heat spreader.

(6) The method of manufacturing a semiconductor device according to any one of (1) to (5), wherein an area of a face of the heat generating body that faces the thermally conductive sheet is 25 mm² or more.

(7) The method of manufacturing a semiconductor device according to any one of (1) to (4), wherein the heat generating body is a semiconductor package provided with a heat spreader, and the heat dissipating body is a heat sink.

(8) The method of manufacturing a semiconductor device according to any one of (1) to (4), wherein the heat generating body is a semiconductor module.

(9) The method of manufacturing a semiconductor device according to any one of (1) to (8), wherein an area of a face of the heat generating body that faces the thermally conductive sheet is 100 mm² or more.

(10) A thermally conductive sheet having a compression modulus of 1.40 MPa or less under a compressive stress of 0.10 MPa at 150° C., and a tack strength of 5.0 N·mm or more at 25° C.,
  the thermally conductive sheet being for use in adhering together a heat generating body and a heat dissipating body of a semiconductor device by disposing the thermally conductive sheet between the heat generating body and the heat dissipating body.

(11) The thermally conductive sheet according to (10), wherein the thermally conductive sheet has a thermal conductivity of 7 W/(mK) or higher, the thermal conductivity being measured using a thermal resistance measured by a steady state method.

(12) The thermally conductive sheet according to (10) or (11), wherein the heat generating body is a semiconductor chip and the heat dissipating body is a heat spreader.

(13) The thermally conductive sheet according to (10) or (11), wherein the heat generating body is a semiconductor package provided with a heat spreader, and the heat dissipating body is a heat sink.

(14) The thermally conductive sheet according to (10) or (11), wherein the heat generating body is a semiconductor module.

(15) A method of manufacturing a thermally conductive sheet, the method including, in a thermally conductive sheet for use in adhering together a heat generating body and a heat dissipating body via the thermally conductive sheet by heating and applying pressure to the heat generating body and the heat dissipating body in a thickness direction of the thermally conductive sheet with the thermally conductive sheet disposed therebetween, determining a compression ratio and a thickness of the thermally conductive sheet such that an amount of compression of the thermally conductive sheet satisfies the following formula:

$$C > L_2 - L_1 \quad \text{Formula:}$$

$L_1$: estimated amount of warpage (μm) of the heat generating body in the heating and applying pressure $L_2$: estimated amount of warpage (μm) of the heat generating body after completion of the heating and applying pressure and having been cooled to 25° C.

C: estimated amount of compression (μm) of the thermally conductive sheet under conditions of the heating and applying pressure C=thickness (μm) of the thermally conductive sheet before the applying pressure×compression ratio (%) under conditions of the heating and applying pressure.

Advantageous Effects of Invention

According to the present disclosure, a method of manufacturing a semiconductor device having an excellent heat dissipation property, a thermally conductive sheet usable in manufacturing a semiconductor device having an excellent heat dissipation property, and a method of manufacturing the thermally conductive sheet are provided.

DESCRIPTION OF EMBODIMENTS

Figure 1:
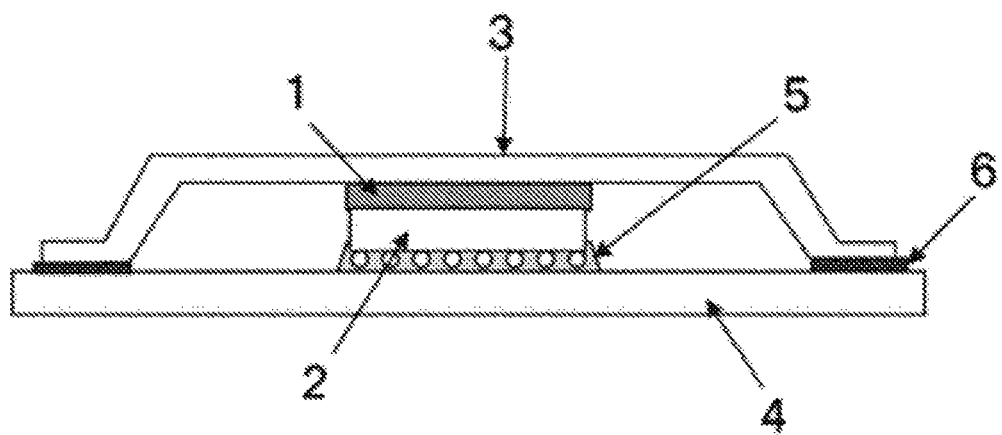
FIG. 1 is a schematic cross-sectional view of a semiconductor device in which a thermally conductive sheet is used as a TIM1.

Embodiments for carrying out the invention will be described below in detail. However, the invention is not limited to the following embodiments. In the following embodiments, components (including elemental steps, etc.) thereof are not essential unless otherwise specified. The same applies to numerical values and ranges, which do not limit the invention.

In the present disclosure, the term "step" encompasses an independent step separated from other steps as well as a step that is not clearly separated from other steps, as long as a purpose of the step can be achieved.

In the present disclosure, a numerical range specified using "(from) . . . to . . . " represents a range including the numerical values noted before and after "to" as a minimum value and a maximum value, respectively.

In the numerical ranges described in a stepwise manner in the present disclosure, the upper limit value or the lower limit value described in one numerical range may be replaced with the upper limit value or the lower limit value of another numerical range described in a stepwise manner. Further, in the numerical ranges described in the present disclosure, the upper limit value or the lower limit value of the numerical ranges may be replaced with the values shown in the Examples.

In the present disclosure, each component may include plural substances corresponding to the component. In a case in which plural substances corresponding to respective components are present in a composition, an amount or content of each component in the composition means the total amount or content of the plural substances present in the composition unless otherwise specified.

In the present disclosure, each component may include plural kinds of particles corresponding to the component. In the case in which plural kinds of particles corresponding to respective components are present in a composition, a particle diameter of the component means a value with respect to the mixture of the plural kinds of particles present in the composition, unless otherwise specified.

The term "layer" as used herein encompasses, when a region in which the layer or the film is present is observed, not only a case in which the layer is formed over the entire observed region, but also a case in which the layer is formed at only a part of the observed region.

The term "layered" as used herein means disposing layers on one another, in which two or more layers may be bonded with each other, or may be attachable to/detachable from one another.

In a case in which an embodiment is described herein with reference to a drawing, the configuration of the embodiment is not limited by the configuration illustrated in the drawing. The sizes of members in respective drawings are conceptual, and the relative relationships between the sizes of the members are not limited thereto.

<<Method of Manufacturing Semiconductor Device>>

A method of manufacturing a semiconductor device in the present disclosure includes adhering together a heat generating body and a heat dissipating body via a thermally conductive sheet by applying pressure to the heat generating body and the heat dissipating body in a thickness direction of the thermally conductive sheet with the thermally conductive sheet disposed therebetween, the thermally conductive sheet having a compression modulus of 1.40 MPa or less under a compressive stress of 0.10 MPa at 150° C., and a tack strength of 5.0 N·mm or more at 25° C. According to the method of manufacturing a semiconductor device in the present disclosure, detachment of the thermally conductive sheet can be suppressed, whereby a semiconductor device having an excellent heat dissipation property can be manufactured.

[Heat Generating Body]

A heat generating body in the present disclosure is an object from which heat is released by adhering thereto a heat dissipating body via a thermally conductive sheet. Examples of the heat generating body include a semiconductor chip, a semiconductor package, a power module for an automobile, and an industrial power module. The heat generating body does not necessarily be one in which the member adjacent to the thermally conductive sheet itself is capable of generating heat. For example, in a case in which the thermally conductive sheet is used as a TIM2 (described below), a heat spreader provided at a semiconductor package and the thermally conductive sheet are in contact with each other. In this case, the semiconductor package provided with the heat spreader is described as a "heat generating body".

The size of the heat generating body is not particularly limited. For example, in a case in which the thermally conductive sheet is used as a TIM1 (described below), the area of the face of the heat generating body that faces the thermally conductive sheet may be 25 mm$^2$ or more, 100 mm$^2$ or more, 200 mm$^2$ or more, or 400 mm$^2$ or more. The area of the face of the heat generating body that faces the thermally conductive sheet may be 15,000 mm$^2$ or less, 5000 mm$^2$ or less, or 2000 mm$^2$ or less.

In a case in which the thermally conductive sheet is used as a TIM2 (described below), the area of the face of the heat generating body that faces the thermally conductive sheet may be 100 mm$^2$ or more, 400 mm$^2$ or more, or 1000 mm$^2$ or more. The area of the face of the heat generating body that faces the thermally conductive sheet may be, for example, 40,000 mm$^2$ or less, 20,000 mm$^2$ or less, or 5000 mm$^2$ or less.

In a case in which the thermally conductive sheet is used for a power device (described below), the area of the face of the heat generating body that faces the thermally conductive sheet may be 100 mm$^2$ or more, 400 mm$^2$ or more, or 1000 mm$^2$ or more. The area of the face of the heat generating body that faces the thermally conductive sheet may be, for example, 40,000 mm$^2$ or less, 20,000 mm$^2$ or less, or 5000 mm$^2$ or less.

[Heat Dissipating Body]

A heat dissipating body in the present disclosure is a member that dissipates heat from a heat generating body via a thermally conductive sheet. Examples of the heat dissipating body include a heat spreader, a heat sink, and a water cooling pipe.

[Thermally Conductive Sheet]

A thermally conductive sheet in the present disclosure is a sheet for use in adhering together a heat generating body and a heat dissipating body of a semiconductor device by being disposed between the heat generating body and the heat dissipating body. A sheet herein means a product in a sheet shape, which is not liquid, and is distinguished from grease, which is liquid. Here, "liquid" indicates a material having a viscosity of 1000 Pa·s or less at 25° C. The viscosity is defined as a value measured by a rheometer at a shear rate of 5.0 s$^{-1}$ at 25° C. The "viscosity" is measured at a temperature of 25° C. as a shear viscosity using a rotational shear viscometer equipped with a cone plate (diameter: 40 mm, cone angle: 0°).

In a case in which grease is used as a thermally conductive material between a heat generating body and a heat dissipating body, thermal resistance may increase owing to pump-out during the thermal cycling. However, the manufacturing method in the present disclosure does not experience the pump-out since a thermally conductive sheet is used.

Further, in a case in which a sheet is used as a thermally conductive material, there are cases in which, in conjunction with an increase in the amount of warpage of the heat generating body, detachment of the sheet occurs, impeding realization of the desired heat dissipation property. However, the thermally conductive sheet used herein can maintain sufficient contact areas to the heat generating body and to the heat dissipating body even in a semiconductor package having an increased amount of warpage, by adjusting to the warpage. This allows for ensuring an excellent heat dissipation property. While the reason for this is not necessarily clear, it is thought that, by pressing a heat generating body and a heat dissipating body with a thermally conductive sheet having the specific compression modulus and tack strength disposed therebetween, the thermally conductive sheet is sufficiently compressed while being sufficiently adhered to the heat generating body and the heat dissipating body, and consequently, the thermally conductive sheet can maintain the contact areas by adjusting to the warpage even when the amount of warpage changes after the pressing.

If the thermally conductive sheet can maintain the contact areas without detaching from the heat generating body and the heat dissipating body, increase in contact heat resistance can be suppressed, whereby deterioration in heat dissipation property of the semiconductor device can be suppressed. Accordingly, it is desired that the contact areas between the thermally conductive sheet and the heat generating body and heat dissipating body are maintained when the heat generating body warps.

The use of the thermally conductive sheet used herein is not particularly limited as long as it is used for adhering together a heat generating body and a heat dissipating body by being disposed between the heat generating body and the heat dissipating body. The thermally conductive sheet may be, for example, a thermal interface material 1 (TIM1) to be disposed between a semiconductor chip and a heat spreader, which are a heat generating body and a heat dissipating body, respectively. Further, the thermally conductive sheet may be a thermal interface material 2 (TIM2) to be disposed between a semiconductor package provided with a heat spreader and a heat sink, which are a heat generating body and a heat dissipating body, respectively. Moreover, the thermally conductive sheet may be a thermally conductive material to be disposed between a semiconductor module, which is a heat generating body, and a heat dissipating body, such as a thermally conductive material for a power device.

In particular, in the field of TIM1, in which grease has been conventionally used, the thermally conductive sheet used herein is particularly useful in view of the fact that it has become difficult to ensure sufficient heat dissipation with grease in conjunction with the increase in size of heat generating bodies.

A specific example of the embodiments that employs the thermally conductive sheet as a TIM1 will be described in reference to FIG. 1. A thermally conductive sheet 1 is used and tightly adhered to a semiconductor chip 2 (heat generating body) on one side, while the other side is adhered to a heat spreader 3 (heat dissipating body). In, FIG. 1, the semiconductor chip 2 (heat generating body) is fixed to a substrate 4 using an underfill material 5, and the heat spreader 3 (heat dissipating body) is fixed to the substrate 4 using a seal material 6, the adherence between the thermally conductive sheet 1 and the semiconductor chip 2 and heat spreader 3 being tightened by pressing them. By the heat generating body and the heat dissipating body being layered via the thermally conductive sheet, heat from the heat generating body can be efficiently transferred to the heat dissipating body. If the heat is efficiently transferred, the life span of the semiconductor device for use is improved and a semiconductor device that stably functions for a long period of use can be provided.

The thermally conductive sheet used herein has a compression modulus of 1.40 MPa or less under a compressive stress of 0.10 MPa at 150° C., and a tack strength of 5.0 N·mm or more at 25° C. By the compression modulus and the tack strength satisfying the above ranges, it is thought that the thermally conductive sheet can maintain its adherence to the heat generating body and the heat dissipating body, even in a semiconductor device with an increased amount of warpage, whereby the contact areas can be maintained. It is thought that this allows for ensuring heat dissipation property.

It is thought that the compression modulus of 1.40 MPa or less under a compressive stress of 0.10 MPa at 150° C. allows the thermally conductive sheet to have a good flexibility and to be readily compressed upon the application of pressure, and thereby to adhere to the heat generating body and the heat dissipating body more easily. Further, it is thought that the thermally conductive sheet can stably adhere to the heat generating body and the heat dissipating body, whereby a decrease in the contact area can be suppressed.

The thermally conductive sheet has a compression modulus of 1.40 MPa or less, preferably 1.30 MPa or less, and more preferably 1.20 MPa or less, under a compressive stress of 0.10 MPa at 150° C. By the compression modulus being 1.20 MPa or less, adhesiveness is further improved, whereby adjustability to warpage is improved. The lower limit of the compression modulus under a compressive stress of 0.10 MPa at 150° C. is not particularly limited. The compression modulus may be 0.50 MPa or more, or 0.70 MPa or more.

The compression modulus of the thermally conductive sheet can be measured using a compression tester (e.g., INSTRON 5948 MICROTESTER, Instron Corporation). A load is applied to the thermally conductive sheet in the thickness direction at a displacement rate of 0.1 mm/min, during which the displacement (mm) and the load (N) are measured. The strain (dimensionless), which is determined as "displacement (mm)/thickness (mm)", and the stress (MPa), which is determined as "load (N)/area (mm$^2$)", are plotted as the abscissa and the ordinate, respectively, and the slope at a certain stress is defined as the compression modulus (MPa). Specifically, the compression modulus can be measured by, for example, the method described in the Examples section.

The thermally conductive sheet has a tack strength at 25° C. of 5.0 N·mm or more, preferably 6.0 N·mm or more, and more preferably 7.0 N·mm or more. By the tack strength being 5.0 N·mm or more, detachment of the thermally conductive sheet from a heat generating body and a heat dissipating body can be suppressed when the gap between the heat generating body and the heat dissipating body is increased by the occurrence of warpage. The upper limit of the tack strength is not particularly limited. The tack strength may be 20.0 N·mm or less, or 15.0 N·mm or less.

The tack strength of the thermally conductive sheet at 25° C. can be measured using a universal physical property tester (e.g., TEXTURE ANALYZER, Eko Instruments Co., Ltd.). A probe having a diameter of 7 mm is pressed against the thermally conductive sheet at a load of 40 N at 25° C. (ambient temperature) and is maintained for 10 seconds, and thereafter is lifted. The tack strength (N·mm) at 25° C. is obtained as an area determined by integrating the load-displacement curve resulting therefrom. Specifically, the tack strength can be measured, for example, by the method described in the Examples section.

The method of obtaining a thermally conductive sheet that has an compression modulus of 1.40 MPa or less under a compressive stress of 0.10 MPa at 150° C. and a tack strength of 5.0 N·mm or more at 25° C. is not particularly limited. For example, such a thermally conductive sheet can be obtained by adjusting the types and the blending ratio of the components used in the thermally conductive sheet, such as a thermally conductive filler and a resin.

The thermal conductivity of the thermally conductive sheet is not particularly limited, and higher thermal conductivity is preferable. The thermally conductive sheet preferably has a thermal conductivity of 7 W/(mK) or higher, more preferably from 10 W/(mK) or higher, and further preferably from 15 W/(mK) or higher, the thermal conductivity being obtained using a thermal resistance measured by a steady state method. By the thermal conductivity being 7 W/(mK) or higher, increase in thermal resistance tends to be suppressed even if the thermally conductive sheet is thickened in order to improve adjustability to warpage of the heat generating body.

In the present disclosure, the thermal conductivity of the thermally conductive sheet is specifically determined as follows.

A thermally conductive sheet is cut into a 10 mm×10 mm piece, which is then disposed between a transistor (2SC2233) and a copper block, which are a heat generating body and a heat dissipating body, respectively. A current is applied to the transistor while the transistor is pressed at a pressure of 0.14 MPa at 80° C., at which time the temperature of the transistor T1 (° C.) and the temperature of the copper block T2 (° C.) are measured. A thermal resistance value X per unit area of 1 cm$^2$ (K·cm$^2$/W) is calculated based on the measured values and the applied electric power W1 (W) as follows.

$$X=(T1-T2)\times 1/W1$$

Further, the thermal conductivity λ (W/(mK)) is calculated using the thickness t (μm) as follows.

$$\lambda=(t\times 10^{-6})/(X\times 10^{-4})$$

The thickness of the thermally conductive sheet is not particularly limited, and may be determined as appropriate in accordance with, for example, specifications of the semiconductor package or the like for which the thermally conductive sheet is to be used. The smaller the thickness is, the lower the thermal resistance tends to be, while the greater the thickness is, the more the adjustability to warpage tends to improve. The thermally conductive sheet may have an average thickness of from 50 to 3,000 μm and, from the viewpoints of thermal conductivity and adhesiveness, the thermally conductive sheet preferably has an average thickness of from 100 to 500 μm, and more preferably from 150 to 300 μm. The average thickness of the thermally conductive sheet can be determined by measuring the thickness at three spots using a micrometer and taking the arithmetic mean of the measured values. The average thickness of the thermally conductive sheet may be determined based on the amount of warpage of the heat generating body in a manner described later.

The amount of compression of the thermally conductive sheet is not particularly limited. For example, the amount of compression under a compressive stress of 0.10 MPa at 150° C. may be from 20 to 1000 μm, from 30 to 200 μm, or from 40 to 100 μm. These values may also be applied to the amount of compression under a compressive stress of 0.15 MPa at 150° C.

The "amount of compression" of a thermally conductive sheet refers to an amount of compression of the thermally conductive sheet that is being pressed in the thickness direction thereof, and is a value obtained by subtracting the thickness of the thermally conductive sheet that is being pressed from the thickness of the thermally conductive sheet before being pressed.

The compression ratio of the thermally conductive sheet is not particularly limited. For example, the compression ratio under a compressive stress of 0.10 MPa at 150° C. may be from 10 to 60%, from 15 to 50%, or from 15 to 40%. These values may also be applied to the compression ratio under a compressive stress of 0.15 MPa at 150° C.

The "compression ratio" of a thermally conductive sheet is a ratio (%) of the amount of compression (μm) with respect to the thickness (μm) of the thermally conductive sheet before being pressed.

A thermally conductive sheet provided with a protective film for protecting its adhesive surface on at least one side of the thermally conductive sheet may be prepared and used. In this case, a thermally conductive sheet, from which the protective film has been peeled off, is used for adhering together a heat generating body and a heat dissipating body. Examples of the protective film include: a resin film of polyethylene, polyester, polypropylene, polyethylene terephthalate, polyimide, polyether imide, polyether naphthalate or methyl pentene, polytetrafluoroethylene, ethylene tetrafluoroethylene copolymer, or perfluoroalkoxyalkane; a coated paper; a coated fabric; and a metallic foil of aluminum. One kind of protective film may be used singly, or two or more kinds thereof may be used in combination to form a multilayered film. It is preferable that the protective film is surface-treated with a releasing agent or the like, such as a silicone-based releasing agent or a silica-based releasing agent.

The thermally conductive film may have any composition as long as it satisfies the above-described specific compression modulus and tack strength. Examples include a thermally conductive sheet containing a resin and a thermally conductive filler.

Examples of the thermally conductive filler include aluminum nitride, aluminum oxide, boron nitride, titanium oxide, zinc oxide, silicon carbide, silicon, silicon oxide, silica, glass, metal particles, carbon fibers, graphite, graphene, and carbon nanotubes. The thermally conductive filler may be surface-treated. One kind of thermally conductive filler may be used singly, or two or more kinds thereof may be used in combination.

The shape of the thermally conductive filler is not particularly limited, and may be spherical, ellipsoidal, flaky, granular, cylindrical, acicular or fibrous.

The average particle diameter of the thermally conductive filler is not particularly limited, and is preferably determined in accordance with the material of the thermally conductive filler or the like.

The aspect ratio (major axis/minor axis) of the thermally conductive filler is not particularly limited, and may be within the range of from 1 to 100, from 5 to 50, or from 10 to 40. The aspect ratio of the thermally conductive filler refers to an arithmetic mean value of measurement values obtained by measuring the ratio of the major axis with respect to the minor axis in 20 representative particles using a scanning electron microscope (SEM).

From the viewpoint of thermal conductivity, the thermally conductive filler is preferably oriented in the thickness direction of the thermally conductive sheet. The expression "oriented in the thickness direction" herein means that, in a thermally conductive filler having a major axis and a minor axis (i.e., having an aspect ratio exceeding 1), the angle between the major axis of the thermally conductive filler and the surface (i.e., main face) of the thermally conductive sheet (also referred to as "angle of orientation") is 60° or more. The angle of orientation is preferably 80° or more, more preferably 85° or more, and further preferably 88° or more.

The content of the thermally conductive filler in the thermally conductive sheet is preferably determined in view of the balance between thermal conductivity and adhesiveness and the like, in accordance with the material or the like of the thermally conductive filler. For example, the content of the thermally conductive filler may be from 25 to 75% by volume, from 30 to 60% by volume, or from 35 to 50% by volume, with respect to the total volume of the thermally conductive sheet.

The resin contained in the thermally conductive sheet is not particularly limited, and may be, for example, a thermosetting resin or a non-thermosetting resin. Examples of the resin include an epoxy resin, silicone, an acrylic resin, a polyimide resin, a bismaleimide resin, a benzocyclobutene resin, a phenol resin, an unsaturated polyester, a diallyl phthalate resin, polyurethane, polyimide silicone, a thermosetting polyphenylene ether, a thermosetting modified polyphenylene ether, polybutene, polyisoprene, polysulfide, an acrylonitrile rubber, a silicone rubber, a carbohydrate resin, a terpene resin, a terpene phenolic resin, and a hydrogenated terpene phenol. One kind of resin may be used singly, or two or more kinds thereof may be used in combination.

The amount of the resin in the thermally conductive sheet is preferably determined in accordance with, for example, the type of resin or desired flexibility, tackiness, adhesiveness, sheet strength or resistance to hydrolysis. For example, the content of the resin is preferably from 25 to 75% by volume, more preferably from 40 to 70% by volume, and further preferably from 50 to 65% by volume, with respect to the total volume of the thermally conductive sheet.

The thermally conductive sheet may include an additive of a different kind in addition to the thermally conductive filler and the resin, such as a flame retardant or an antioxidant. The flame retardant is not particularly limited and may be selected from commonly used flame retardants as appropriate. Examples thereof include a red phosphorus flame retardant and a phosphate flame retardant. In particular, a phosphate flame retardant is preferable from the viewpoints of excellent safety and improved adhesiveness due to its plasticization effect.

The method of manufacturing the thermally conductive sheet is not particularly limited as long as a thermally conductive sheet having the above-described specific compression modulus and tack strength can be obtained. For example, the sheet may be produced by preparing a composition containing respective components of the thermally conductive sheet, and forming a sheet by rolling, pressing, extruding, coating or the like.

Further, the sheet may be produced by forming a shaped body using a composition containing respective components of the thermally conductive sheet, and slicing the shaped body. In this case, it is preferable that the shaped body is sliced such that the thermally conductive filler becomes oriented in the thickness direction.

In an embodiment, the thermally conductive sheet may be produced by preparing a composition containing respective components of the thermally conductive sheet, forming the composition in a sheet shape to obtain a sheet, forming a layered body by layering respective sheets on one another, and slicing a side face of the layered body. By producing a thermally conductive sheet using this method, efficient thermal conduction paths tend to be formed, and a thermally conductive sheet having a high thermal conductivity and excellent adhesiveness tends to be obtained. The obtained thermally conductive sheet may further be pasted to and laminated with a protection film.

[Method of Adhering Heat Generating Body and Heat Dissipating Body]

The method of manufacturing a semiconductor device in the present disclosure includes adhering together a heat generating body and a heat dissipating body via a thermally conductive sheet by applying pressure to the heat generating body and the heat dissipating body in a thickness direction of the thermally conductive sheet with the thermally conductive sheet disposed therebetween.

The term "adhering" herein means that plural faces are in contact with each other owing to a chemical or physical force, or both. According to the method of manufacturing a semiconductor device in the present disclosure, the contact area between the heat generating body and the thermally conductive sheet, between the heat dissipating body and the thermally conductive sheet, or both, tends to be favorably maintained. The contact area in a semiconductor device assembled by adhering together a heat generating body and a heat dissipating body via a thermally conductive sheet is preferably 80% or more, more preferably 85% or more, further preferably 90% or more, and still more preferably 95% or more, with respect to the area of the face of the heat generating body or the heat dissipating body that faces the thermally conductive sheet.

For disposing the thermally conductive sheet between the heat generating body and the heat dissipating body, a method may be employed in which the thermally conductive sheet is first disposed on the heat generating body, after which the heat dissipating body is disposed thereon via the thermally conductive sheet, or a method may be employed in which the thermally conductive sheet is first disposed on the heat dissipating body, after which the heat generating body is disposed thereon via the thermally conductive sheet.

One heat generating body and one heat dissipating body may be employed, or a plural of at least one of the heat generating body or heat dissipating body may be employed, with respect to one thermally conductive sheet.

The heat generating body and the heat dissipating body are adhered with each other via the thermally conductive sheet by applying pressure to the heat generating body and the heat dissipating body in a thickness direction of the thermally conductive sheet with the thermally conductive sheet disposed therebetween. In this process, the pressure may be applied from the side of the heat generating body, or from the side of the heat dissipating body.

The pressure applied in the thickness direction of the thermally conductive sheet is preferably from 0.05 to 10.00 MPa, more preferably from 0.10 to 5.00 MPa, and further preferably from 0.10 to 1.00 MPa, from the viewpoints of adhesion of the thermally conductive sheet and reducing the stress on the electronic component. The pressure is particularly preferably from 0.10 to 0.50 MPa from the viewpoint of reducing the stress on the electronic component. The pressure may be adjusted in accordance with the thickness of the thermally conductive sheet from the viewpoint of ensuring the adhesion of the thermally conductive sheet. For example, the pressure may be 0.20 MPa or less in a case in which the thickness of the thermally conductive sheet is 200 μm or more, and may be over 0.20 MPa in a case in which the thickness of the thermally conductive sheet is less than 200 μm.

The temperature during the application of the pressure is not particularly limited, and the temperature range is preferably determined in accordance with the type of the thermally conductive sheet. The temperature during the application of the pressure may be ambient temperature, and is preferably an increased temperature from the viewpoint of improving the compression ratio. The increased temperature may be, for example, from 80 to 200° C., from 100 to 190° C., or from 120 to 180° C.

It is particularly preferable that the pressure of from 0.10 to 1.00 MPa is applied in the temperature range of from 120 to 180° C. By the pressure being 0.10 MPa or more, or the increased temperature being 120° C. or more, favorable adhesion tends to be obtained. By the pressure being 1.00 MPa or less or the increased temperature being 180° C. or lower, adhesion reliability tends to be further improved. It is thought that this is because thinning of the thermally conductive sheet caused by excessive compression can be suppressed, or because excessive increase in residual stress or deformation of surrounding members can be suppressed.

The amount of warpage of the heat generating body during the application of pressure, for example, the amount of warpage of the heat generating body when the pressure of 0.10 MPa is applied at 150° C., may be 10 μm or more, 20 μm or more, or 25 μm or more. The amount of warpage of the heat generating body during the application of pressure, for example, the amount of warpage of the heat generating body when the pressure of 0.10 MPa is applied at 150° C., may be 80 μm or less, 70 μm or less, or 60 μm or less. The above ranges may apply to the amount of warpage of the heat generating body under the pressure of 0.15 MPa at 150° C.

The amount of warpage of the heat generating body after the release of the pressure may be, for example, 40 μm or more, 50 μm or more, or 60 μm or more. The amount of warpage of the heat generating body after the release of the pressure may be 150 μm or less, 140 μm or less, or 130 μm or less. In a case in which the amount of warpage fluctuates in accordance with the temperature change after the release of the pressure, the "amount of warpage of the heat generating body after the release of the pressure" means the amount of warpage at 25° C.

In the process of adhering the heat generating body and the heat dissipating body, the difference between the amount of warpage of the heat generating body during the application of the pressure and the amount of warpage of the heat generating body after the release of the pressure may be 30 μm or more, 40 μm or more, or 45 μm or more. The upper limit of the difference may be, for example, 120 μm or less.

The "amount of warpage" of a heat generating body refers to the amount of maximum deformation (μm) in the thickness direction of the heat generating body during the deformation of the heat generating body by warpage.

Figure 2:
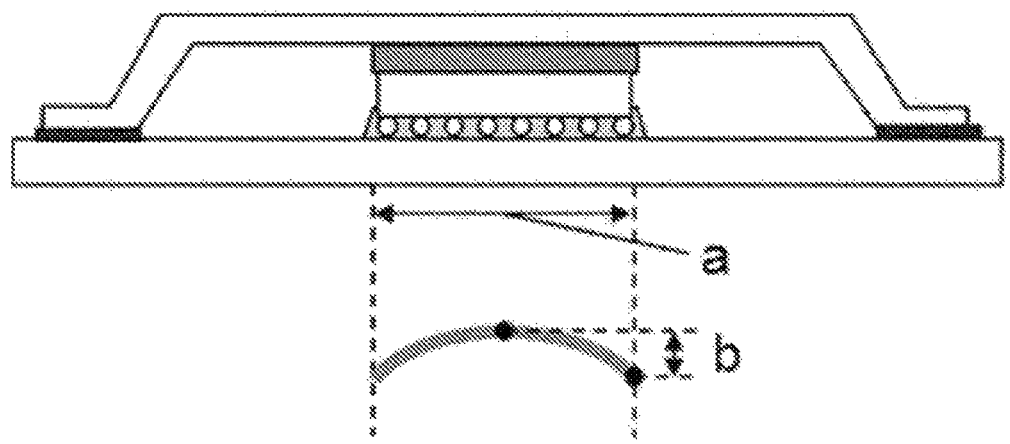
FIG. 2 is a diagram illustrating the amount of warpage in a semiconductor device in which a thermally conductive sheet is used as a TIM1.

An example of the method of measuring the amount of warpage in the case in which the thermally conductive sheet is used as a TIM 1 will be explained with reference to FIG. 2. The amount of warpage can be measured based on the amount of deformation of the substrate mounted with a heat generating body as described below. The area subjected to the analysis of the amount of warpage is the area denoted by "a" on which the heat generating body is mounted (the portion of the heat generating body), viewed from the direction of the substrate. In the portion of the heat generating body "a", the displacement between the portion having the maximum amount of deformation in the thickness direction of the substrate and the edge of the heat generating body is defined as the amount of warpage "b".

The larger the amount of warpage, the more likely it is that the thermally conductive sheet detaches from the heat generating body and the heat dissipating body upon the occurrence of warpage. The thermally conductive sheet used herein tends to be able to maintain a favorable contact area without detaching from the heat generating body and the heat dissipating body even if the amount of warpage of the heat generating body is large.

The specific method for adhering the heat generating body and the heat dissipating body via the thermally conductive sheet is not particularly limited as long as it can fix the heat generating body and the heat dissipating body tightly adhered with each other. For example, a method may be employed in which a thermally conductive sheet is disposed between a heat generating body and a heat dissipating body and fixed with a jig capable of pressurizing them at approximately 0.05 to 1.00 MPa, in which state the heat generating body is allowed to generate heat, or is heated to 80 to 180° C. in an oven or the like. The examples also include a method in which a pressing machine capable of heating to 80 to 180° C. and applying pressure at 0.05 to 1.00 MPa is used.

The fixation may be performed by using a jig, such as a clip, a screw, or a spring. It is preferable that the heat generating body and the heat dissipating body are further fixed with a commonly employed means, such as an adhesive, from the viewpoint of maintaining the adhesion.

The semiconductor device can be manufactured using a heat generating body and a heat dissipating body adhered with each other via a thermally conductive sheet, as described above. The type of semiconductor device is not particularly limited, and examples thereof include an electronic material mounted with an integrated circuit (IC) such as a CPU or a memory. Further, the examples also include a power device such as a bipolar transistor, a power MOSFET or an IGBT.

<<Method of Manufacturing Thermally Conductive Sheet>>

An embodiment in the present disclosure includes, in a thermally conductive sheet for use in adhering together a heat generating body and a heat dissipating body via the thermally conductive sheet by heating and applying pressure to the heat generating body and the heat dissipating body in a thickness direction of the thermally conductive sheet with the thermally conductive sheet disposed therebetween, determining a compression ratio and a thickness of the thermally conductive sheet such that an amount of compression of the thermally conductive sheet satisfies the following formula.

$$C > L_2 - L_1$$ Formula:

$L_1$: estimated amount of warpage (μm) of the heat generating body in the heating and applying pressure $L_2$: estimated amount of warpage (μm) of the heat generating body after completion of the heating and applying pressure and having been cooled to 25° C.

C: estimated amount of compression (μm) of the thermally conductive sheet under conditions of the heating and applying pressure C=thickness (μm) of the thermally conductive sheet before the applying pressure×compression ratio (%) under conditions of the heating and applying pressure The estimated amount of warpage of the heat generating body in the heating and applying pressure ($L_1$) represents an estimated amount of warpage of the heat generating body under an expected pressure and temperature conditions. For example, in a case in which a heat generating body and a heat dissipating body are expected to be adhered with each other via a thermally conductive sheet under a pressure of 0.10 MPa at 150° C., the estimated amount of warpage of the heat generating body in the heating and applying pressure ($L_1$) refers to the estimated amount of warpage under the pressurization condition of 0.10 MPa at 150° C. In a case in which a heat generating body and a heat dissipating body are expected to be adhered with each other via a thermally conductive sheet under a pressure of 0.15 MPa at 150° C., the estimated amount of warpage of the heat generating body in the heating and applying pressure ($L_1$) refers to the estimated amount of warpage under the pressurization condition of 0.15 MPa at 150° C.

The estimated amount of warpage of the heat generating body in the heating and applying pressure ($L_1$) may be, for example, 10 μm or more, 20 μm or more, or 25 μm or more. The estimated amount of warpage of the heat generating body in the heating and applying pressure ($L_1$) may be 80 μm or less, 70 μm or less, or 60 μm or less.

The estimated amount of warpage of the heat generating body after completion of the heating and applying pressure and having been cooled to 25° C. ($L_2$) may be, for example, 40 μm or more, 50 μm or more, or 60 μm or more. The estimated amount of warpage of the heat generating body after completion of the heating and applying pressure and having been cooled to 25° C. ($L_2$) may be 150 μm or less, 140 μm or less, or 130 μm or less.

The difference between $L_1$ and $L_2$ ($L_2-L_1$) may be 30 μm or more, 40 μm or more, or 45 μm or more. The upper limit of the above difference may be, for example, 120 μm or less.

The estimated amount of compression of the thermally conductive sheet under conditions of the heating and applying pressure (C) refers to an estimated amount of compression under an expected pressure and temperature conditions. For example, in a case in which a heat generating body and a heat dissipating body are expected to be adhered with each other via a thermally conductive sheet under a pressure of 0.10 MPa at 150° C., the estimated amount of compression of the thermally conductive sheet under conditions of the heating and applying pressure (C) means an estimated amount of compression under the pressure of 0.10 MPa at 150° C. In a case in which a heat generating body and a heat dissipating body are expected to be adhered with each other via a thermally conductive sheet under a pressure of 0.15 MPa at 150° C., the estimated amount of compression (C) means an estimated amount of compression under the pressure of 0.15 MPa at 150° C.

The estimated amount of compression of the thermally conductive sheet under conditions of the heating and applying pressure (C) may be, for example, from 20 to 1000 μm, from 30 μm to 200 μm, or from 40 μm to 100 μm.

The thickness of the thermally conductive sheet before the applying pressure refers to the average thickness of the thermally conductive sheet before the application of the pressure. Preferable ranges of the thickness of the thermally conductive sheet are as described above.

Preferable ranges of the compression ratio of the thermally conductive sheet are as described above.

It is considered that a thermally conductive sheet manufactured to have a compression ratio and a thickness determined in the manner described above shows a sufficient amount of compression to adjust to the changes of the amount of warpage of a heat generating body in the process of adhering the heat generating body and a heat dissipating body, whereby its detachment is successfully suppressed.

EXAMPLES

The invention will be described in detail below by way of Examples. However, the invention is not limited to these Examples. In the following Examples, the compression modulus, amount of compression, tack strength, thermal conductivity, amount of warpage, and contact area were evaluated by the following methods.

Measurement of Compression Modulus and Amount of Compression

A compression tester equipped with a thermostat chamber (INSTRON 5948 MICROTESTER, Instron Corporation) was used for the measurement. Thermally conductive sheets were cut into a circular shape of 14 mm in diameter for the test. A thermally conductive sheet was arranged between pieces of 0.1 mm-thick paper (release paper), to which a load was applied in the thickness direction of the thermally conductive sheet at a displacement rate of 0.1 mm/min in the thermostat chamber at a temperature of 150° C., during which the displacement (mm) and the load (N) were measured. The strain (dimensionless), which is determined as "displacement (mm)/thickness (mm)", and the stress (MPa), which is determined as "load (N)/area (mm$^2$)", were plotted as the abscissa and the ordinate, respectively, and the slope at a stress of 0.10 MPa was defined as the compression modulus (MPa).

Measurement of Tack Strength

A universal physical property tester (TEXTURE ANA-LYZER, Eko Instruments Co., Ltd.) was used. A probe having a diameter of 7 mm was pressed against the thermally conductive sheet at a load of 40 N at 25° C. (ambient temperature), was maintained for 10 seconds, and thereafter was lifted. The tack strength (N·mm) was obtained as an area determined by integrating a load-displacement curve resulting therefrom.

Measurement of Thermal Conductivity

A thermally conductive sheet was cut into a 10 mm×10 mm piece, which was disposed between a transistor (2SC2233) and a copper block, which are a heat generating body and a heat dissipating body, respectively. A current was applied to the transistor while the transistor was pressed at a pressure of 0.14 MPa at 80° C., at which time the temperature of the transistor T1 (° C.) and the temperature of the copper block T2 (° C.) were measured. A thermal resistance value X per unit area of 1 cm$^2$ (K·cm$^2$/W) was calculated based on the measured values and the applied electric power W1 (W) as follows.

$$X=(T1-T2)\times 1/W1$$

Further, the thermal conductivity λ (W/(mK)) was calculated using the thermal resistance (K·cm$^2$/W) and the thickness t (μm) as follows.

$$\lambda=(t\times 10^{-6})/(X\times 10^{-4})$$

Measurement of Amount of Warpage

The amount of warpage was measured using a 3D thermal surface profiler (THERMOIRÉ PS200, Akrometrix, Inc.). The amount of warpage of the substrate corresponding to the chip area (20 mm×20 mm) was measured.

The amount of warpage of the substrate corresponding to the chip area at 150° C., which is the condition of package assembly, was 29 μm. Further, the amount of warpage of the substrate corresponding to the chip area at 25° C. after the assembly was 75 μm. The difference in the above amounts of warpage was therefore 46 μm.

Assessment Test of Contact Area

The contact area was assessed as follows. The state of adhesion was observed using an ultrasonic imaging diagnostic apparatus (INSIGHT 300, Insight Co., Ltd.) at 35 MHz by a reflection method. The obtained image was binarized using an image analysis software (ImageJ), and the ratio of the adhering area in the 20 mm×20 mm chip portion was calculated to obtain the contact area (%).

For the assessment of the contact area, simple packages fabricated as follows were used. MCL-E-700G® (0.81 mm in thickness, Hitachi Chemical Co., Ltd.) as a substrate, CEL-C-3730N-2 (Hitachi Chemical Co., Ltd.) as an underfill material, and a silicone-based adhesive (SE4450, Dow Corning Toray Co., Ltd.) as a seal material, were used. A 1 mm-thick copper plate having a nickel plating on the surface was used as a heat spreader. The substrate and the heat spreader had a size of 45 mm×45 mm and the semiconductor chip had a size of 20 mm×20 mm. The amount of warpage of the heat generating body under a pressure of 0.15 MPa at 150° C. was 29 μm, and the amount of warpage of the heat generating body after the release of the pressure and cooling to 25° C. was 75 μm.

The package was assembled as follows. A thermally conductive sheet having a certain thickness was cut into a 23 mm×23 mm piece, which was pasted onto the heat spreader. The semiconductor chip was disposed on the heat spreader via the thermally conductive sheet. The members were pressed for three minutes in the thickness direction of the thermally conductive sheet using a high-precision pressure thermal bonding apparatus (HTB-MM, manufactured by Alpha-Design Co., Ltd.) under a certain pressure at a certain temperature. Subsequently, the members were placed in a thermostat chamber at 150° C. for two hours to completely cure the seal material.

Example 1

A 0.3 mm-thick thermally conductive sheet having a compression modulus of 1.16 MPa under a compressive stress of 0.10 MPa at 150° C., a tack strength of 7.6 N·mm at 25° C., and a thermal conductivity of 21 W/(mK), manufactured by Hitachi Chemical Co., Ltd., was selected, with which a package was assembled in the above-described manner under the condition of 150° C., 0.15 MPa, the thermally conductive sheet being adhered to a semiconductor chip and a heat spreader, which are a heat generating body and a heat dissipating body, respectively. The contact area in this case was 99%. The contact area, which is an indicator of warpage adjustability, of 90% or more indicated a good warpage adjustability. The compression ratio of the compressed thermally conductive sheet under 0.15 MPa at 150° C. was 19%, and the amount of compression of the thermally conductive sheet was 57 μm.

Example 2

A 0.2 mm-thick thermally conductive sheet having a compression modulus of 1.16 MPa under a compressive stress of 0.10 MPa at 150° C., a tack strength of 7.6 N·mm at 25° C., and a thermal conductivity of 18 W/(mK), manufactured by Hitachi Chemical Co., Ltd., was selected, with which a package was assembled in the above-described manner under the condition of 150° C., 0.15 MPa, the thermally conductive sheet being adhered to a semiconductor chip and a heat spreader, which are a heat generating body and a heat dissipating body, respectively. The contact area in this case was 95%. The contact area, which is an indicator of warpage adjustability, of 90% or more indicated a good warpage adjustability. The compression ratio of the compressed thermally conductive sheet under 0.15 MPa at 150° C. was 21%, and the amount of compression of the thermally conductive sheet was 47 μm.

Example 3

A 0.15 mm-thick thermally conductive sheet having a compression modulus of 1.16 MPa under a compressive stress of 0.10 MPa at 150° C., a tack strength of 7.6 N·mm at 25° C., and a thermal conductivity of 16 W/(mK), manufactured by Hitachi Chemical Co., Ltd., was selected, with which a package was assembled in the above-described manner under the condition of 150° C., 0.31 MPa, the thermally conductive sheet being adhered to a semiconductor chip and a heat spreader, which are a heat generating body and a heat dissipating body, respectively. The contact area in this case was 90%. The compression ratio of the compressed thermally conductive sheet under 0.31 MPa at 150° C. was 35%, and the amount of compression was 52 μm.

Comparative Example 1

A liquid silicone grease (TK-P3K, manufactured by Sanwa Supply Inc.) having a thermal conductivity of 2 W/(mK) was selected as a thermally conductive material, with which a package was assembled in the above-described manner under the condition of 150° C., 0.03 MPa, the grease being adhered to a semiconductor chip and a heat spreader, which are a heat generating body and a heat dissipating body, respectively. Since the grease is liquid, the compression modulus and tack strength cannot be measured. The thickness of the silicone grease after the assembly was 40 and the contact area was 63%.

Comparative Example 2

A 0.3 mm-thick thermally conductive sheet having a compression modulus of 1.44 MPa under a compressive stress of 0.10 MPa at 150° C., a tack strength of 7.2 N·mm at 25° C., and a thermal conductivity of 20 W/(mK), manufactured by Hitachi Chemical Co., Ltd., was selected, with which a package was assembled in the above-described manner under the condition of 150° C., 0.15 MPa, the thermally conductive sheet being adhered to a semiconductor chip and a heat spreader, which are a heat generating body and a heat dissipating body, respectively. The contact area in this case was 72%. The compression ratio of the compressed thermally conductive sheet under 0.15 MPa at 150° C. was 13%, and the amount of compression of the thermally conductive sheet was 40 μm.

Comparative Example 3

A 0.3 mm-thick thermally conductive sheet having a compression modulus of 1.73 MPa under a compressive stress of 0.10 MPa at 150° C., a tack strength of 1.8 N·mm at 25° C., and a thermal conductivity of 23 W/(mK), manufactured by Hitachi Chemical Co., Ltd., was selected, with which a package was assembled in the above-described manner under the condition of 150° C., 0.15 MPa, the thermally conductive sheet being adhered to a semiconductor chip and a heat spreader, which are a heat generating body and a heat dissipating body, respectively. The contact area in this case was 74%. The compression ratio of the compressed thermally conductive sheet under 0.15 MPa at 150° C. was 13%, and the amount of compression of the thermally conductive sheet was 44 μm.

Comparative Example 4

A 0.3 mm-thick thermally conductive sheet having a compression modulus of 1.35 MPa under a compressive stress of 0.10 MPa at 150° C., a tack strength of 3.8 N·mm at 25° C., and a thermal conductivity of 18 W/(mK), manufactured by Hitachi Chemical Co., Ltd., was selected, with which a package was assembled in the above-described manner under the condition of 150° C., 0.15 MPa, adhering the thermally conductive sheet to a semiconductor chip and to a heat spreader, which are a heat generating body and a heat dissipating body, respectively. The contact area in this case was 78%. The compression ratio of the compressed thermally conductive sheet under 0.15 MPa at 150° C. was 16%, and the amount of compression of the thermally conductive sheet was 48 μm.

As described above, when a heat generating body and a heat dissipating body were adhered with each other using the method in accordance with the Examples, good contact area was maintained. It is considered that this enables to obtain a semiconductor device having a favorable heat dissipation property.

All the documents, patent applications and technical standards that are described in the present specification are hereby incorporated by reference to the same extent as if each individual document, patent application or technical standard is concretely and individually described to be incorporated by reference.

EXPLANATION OF REFERENCE NUMERALS 1 thermally conductive sheet
2 semiconductor chip (heat generating body)
3 heat spreader (heat dissipating body)
4 substrate
5 underfill material
6 seal material
a portion of heat generating body (area of analysis)
b amount of warpage

The invention claimed is:
1. A thermally conductive sheet having a compression modulus of from 0.50 to 1.40 MPa, and having a tack strength that is greater than or equal to 5.0 N·mm and less than or equal to 20.0 N·mm at 25° C., wherein the thermally conductive sheet comprises a resin and a thermally conductive filler.
2. The thermally conductive sheet according to claim 1, wherein the thermally conductive sheet has a thermal conductivity of 7 W/(mK) or higher, the thermal conductivity being measured using a thermal resistance measured by a steady state method.
3. A semiconductor device, comprising:
a thermally conductive sheet having a compression modulus of from 0.50 to 1.40 MPa, and having a tack strength that is greater than or equal to 5.0 N·mm and less than or equal to 20.0 N·mm at 25° C., wherein the thermally conductive sheet comprises a resin and a thermally conductive filler,
the thermally conductive sheet adhering together a heat generating body and a heat dissipating body of the semiconductor device, by being disposed between the heat generating body and the heat dissipating body, wherein the heat generating body is a semiconductor chip and the heat dissipating body is a heat spreader.

4. The semiconductor device of claim 3, wherein the heat generating body is a semiconductor package provided with a heat spreader, and the heat dissipating body is a heat sink.

5. The semiconductor device of claim 3, wherein the heat generating body is a semiconductor module.

\* \* \* \* \*